United States Patent [19]

Camlibel et al.

[11] Patent Number: 4,538,342
[45] Date of Patent: Sep. 3, 1985

[54] FORMING PLATINUM CONTACTS TO IN-BASED GROUP III-V COMPOUND DEVICES

[75] Inventors: Irfan Camlibel, Stirling; Aland K. Chin, Berkeley Heights; Brymer H. Chin, North Plainfield; Christie L. Zipfel, Summit, all of N.J.

[73] Assignee: AT&T Bell Laboratories, Murray Hill, N.J.

[21] Appl. No.: 621,082

[22] Filed: Jun. 15, 1984

[51] Int. Cl.³ .......................................... H01L 21/285
[52] U.S. Cl. .................................. 29/569 L; 29/589; 357/67; 427/42; 427/91
[58] Field of Search ................ 29/569 L, 589; 427/42, 427/88, 91, 125; 357/17, 67

[56] References Cited

U.S. PATENT DOCUMENTS

| 4,287,527 | 9/1981 | Bachmann et al. | 357/15 X |
| 4,359,485 | 11/1982 | Donnelly et al. | 427/92 X |
| 4,414,561 | 11/1983 | Keramidas et al. | 357/67 |

OTHER PUBLICATIONS

"The Migration of Gold from the p–Contact as a Source of Dark Spot Defects in InP/InGaAsP LED's", *IEEE Transactions On Elec. Devices*, vol. 30, No. 4, pp. 304–310, Apr. 1983, A. K. Chin et al.
"Metallization for Diode Lasers", *J. of Vacuum Sciences and Technology*", vol. 19, No. 3, Sep./Oct. 1981, pp. 799–802, M. Ettenberg et al.
"InGaAsP/InP D.H. L.E.D.S. For Fibre–Optical Communications", *Electronics Letters*, vol. 14, No. 16, Aug. 1978, pp. 499–500, I. Umebu, et al.
"TEM Observations of Laser–Induced Pt and Au Deposition on InP", *J. of Electrochemical Society*, vol. 130, No. 7, Jul. 1983, pp. 1473–1475, D. Brasen et al.
"Interfacial Reaction and Schottky Barrier Between Pt and GaAs", *J. Applied Physics*, vol. 54, No. 3, Mar. 1983, pp. 1404–1412, C. Fontaine et al.
"Reliability of High Radiance InGaAsP/InP LED's Operating in the 1.2–1.3 μm Wavelength", *IEEE Journal of Quantum Electronics*, vol. QE–17, No. 2, Feb. 1981, pp. 167–173, S. Yamakoshi et al.

Primary Examiner—Brian E. Hearn
Assistant Examiner—Alan E. Schiavelli
Attorney, Agent, or Firm—Michael J. Urbano

[57] ABSTRACT

Electrical contacts with low specific-contact resistance to In-based Group III-V compound semiconductors (e.g., p-InGaAsP) are formed by electron beam depositing a thin Pt layer directly on the semiconductor and sintering at about 450°–525° C. for about 5–30 minutes. Light emitting diodes without dark spot defects can be fabricated using this technique.

11 Claims, 1 Drawing Figure

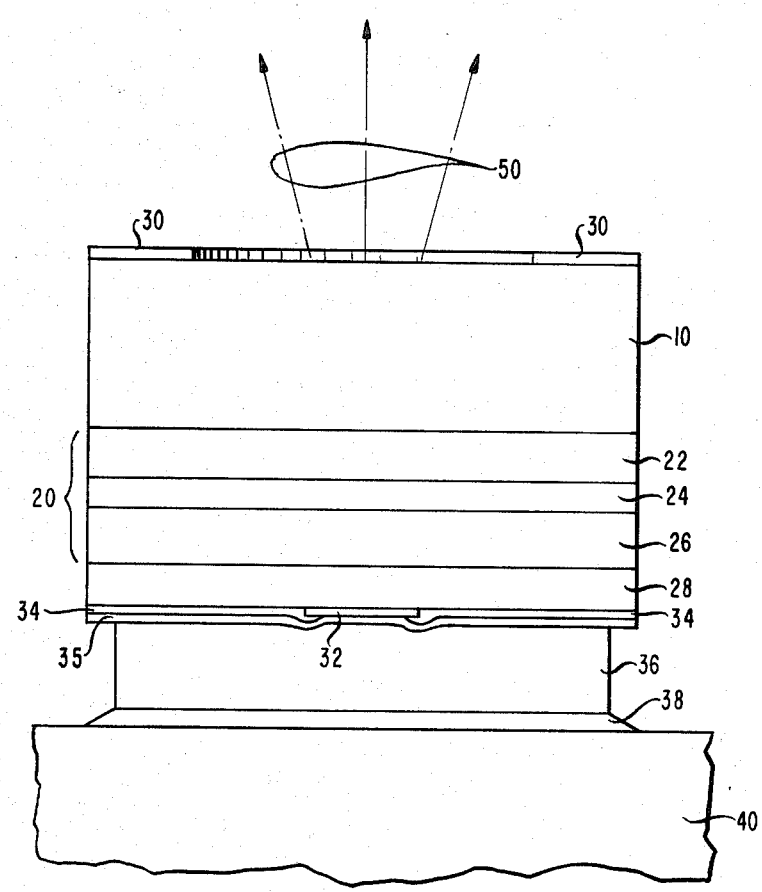

FORMING PLATINUM CONTACTS TO IN-BASED GROUP III-V COMPOUND DEVICES

BACKGROUND OF THE INVENTION

This invention relates to semiconductor devices and, more particularly, to electrical contacts to In-based devices such as light emitting diodes (LEDs).

Alloyed metallizations, involving a dopant in a gold matrix, form low specific-contact resistance electrical contacts to Group III-V compound semiconductors. However, it is well established that gold-based metallizations interact strongly with Group III-V semiconductors. GaAs/GaAlAs and InP/InGaAsP LEDs using gold-based contacts to p-type material (i.e., "p-contacts") degrade rapidly when dark, nonradiative areas, known as dark spot defects (DSDs) eventually develop within the light-emitting region. These dark areas form because gold from the p-contact migrates into various epitaxial layers as described by A. K. Chin et al, *IEEE Transactions Electron Devices*, Vol. 30, p. 304 (1983). The gold migration is accelerated by elevated temperatures and high current densities required in some transmission system applications.

To improve device reliability, nongold-based p-contacts such as nonsintered Ti/Pt have been used between the semiconductor and a gold bonding layer. However, in order to obtain a low specific-contact resistance, the semiconductor wafer must first be diffused with a p-type dopant such as Zn. This diffusion step is often responsible for variations in contact resistance as described by M. Ettenberg et al, *Journal of Vacuum Sciences and Technology*, Vol. 19, p. 799 (1981).

SUMMARY OF THE INVENTION

We have developed a nongold-based metallization procedure that does not require an initial diffusion step. The procedure includes depositing a thin layer of Pt onto the InP-based layer (e.g., InGaAsP) and then sintering at about 450°–525° C. for about 5–30 minutes. Specific-contact resistances of $1-2 \times 10^{-5} \Omega$-cm$^2$ were realized. Incorporation of this metallization procedure into the fabrication of high radiance, 1.3 $\mu$m InP/InGaAsP LEDs improved device reliability by limiting the penetration of the contact metal into the semiconductor and eliminating DSDs.

BRIEF DESCRIPTION OF THE DRAWING

Our invention, together with its various features and advantages, can be readily understood from the following more detailed description taken in conjunction with the accompanying drawing, in which the sole FIGURE depicts schematically a cross-sectional view of a LED in accordance with one embodiment of our invention. In the interests of clarity the FIGURE has not been drawn to scale.

DETAILED DESCRIPTION

Turning now to the FIGURE, a front-emitting LED is shown comprising a single crystal substrate 10 on which a double heterostructure (DH) 20 is epitaxially grown by any of several suitable techniques (e.g., liquid phase epitaxy or chemical vapor deposition). The DH 20 includes a wide bandgap first cladding layer 22 of the same conductivity type as the substrate, a narrower bandgap intermediate region 24 of either conductivity type, and a wide bandgap second cladding layer 26 of the opposite conductivity type. Intermediate region 24 may be a single active layer or a composite of several layers in which case at least one is active (in the light-emitting sense), whereas others may serve different functions (e.g., anti-meltback for 1.55 $\mu$m LEDs). Finally, a contact-facilitating layer 28 is grown on layer 26. All of the layers are essentially lattice matched to one another and are compounds of the Group III–V materials system.

Electrical contacts are formed on opposite sides of the device; i.e., an annular contact 30 on the substrate 10 and a dot contact 32 on layer 28. A dielectric layer 34 is formed on layer 28 with an aperture in registration with contact 32. A metal adherence coating 35 is deposited full surface over dielectric layer 34 and contact 32. This side of the device is then thermally coupled to a heat sink 40 via a metal pad 36 and a bonding layer 38. Metal pad 36 is plated onto adherence coating 35.

In operation, the cladding layers are forward biased by a source (not shown) which also provides pumping current at a level commensurate with the desired optical output power. The optical output, depicted as light rays 50, is emitted through the annular contact 30 and is generated by radiative recombination of minority carriers in the active layer. The wavelength of the light output is determined by the bandgap of the active layer.

In an illustrative embodiment, the LED comprises an n-InP substrate 10, an n-InP first cladding layer 22, an n-InGaAsP ($\lambda = 1.3$ $\mu$m) active layer 24, a p-InP second cladding layer 26, and a p-InGaAsP ($\lambda = 1.1$ $\mu$m) contact-facilitating layer 28. Of course, the active layer could be intentionally doped p-type or n-type or left unintentionally doped and could be designed for operation over a range of wavelengths (e.g., 1.0–1.65 $\mu$m) depending on its specific composition. Moreover, the contact-facilitating layer may be InGaAs. The contacts, on the other hand, include an alloyed annular contact 30 made of a Au/Sn/Cr/Au sandwich metallization and a sintered Pt dot contact 32 as described below. Illustratively, dielectric layer 34 comprises SiO$_2$, metal pad 36 comprises plated Au, bonding layer 38 comprises an epoxy, and heat sink 40 comprises Au-plated Cu.

In accordance with our invention, in order to obtain a low specific-contact resistance to the p-type In-based layer 28 and, in addition, to avoid the formation of DSDs caused by migration of the contact metal into the semiconductor, the contact 32 is a thin layer (e.g., 500 Å or 1000 Å) of essentially pure Pt which is sintered at a temperature of about 450°–525° C. for a time of about 5–30 minutes. Under these conditions, specific-contact resistances of about $1-2 \times 10^{-5} \Omega$-cm$^2$ are obtained, with the lowest values being achieved at about 500° C. for 15–30 minutes for a 500 Å thick Pt layer. The sintering step results in the formation of an intermetallic interfacial layer between the In-based semiconductor and the Pt layer. This interfacial layer probably includes PtIn$_2$, PtP$_2$, PtGa and PtAs$_2$ when layer 28 comprises InGaAsP. This value of contact resistance is equivalent to the best achievable with prior art BeAu contacts, but the sintered Pt contact avoids the problem of Au migration (and hence DSDs) and eliminates the need for a Ti/Pt barrier layer (and attendant Zn diffusion into the semiconductor) to prevent the Au migration.

In practice, the Pt dot contact is preferably deposited by electron beam evaporation (e.g., through a shadow mask to delineate its shape). Moreover, the sintering step preferably takes place in a reducing ambient (e.g., H$_2$ or forming gas). During this step, at least the top surface of layer 28 should be capped (e.g., with SiO$_2$) to prevent out-diffusion of volatile species (e.g., P).

Although our experimental work has verified the usefulness of Pt contacts 500 Å and 1000 Å thick, we expect that a much broader range is suitable, for example, about 100–2000 Å. Below about 100 Å there may be insufficient Pt to form the intermetallic interfacial layer, and above about 2000 Å stress induced between the contact and the semiconductor may be undesirable.

EXAMPLE

The following example is provided by way of illustration only. Unless otherwise specified, specific materials, process conditions, and other parameters are not intended to limit the scope of the invention.

Front-emitting LEDs of the type shown in the FIGURE were fabricated from InP/InGaAsP layers by liquid-phase epitaxy on a (100)-oriented S-doped ($5 \times 10^{18}$ cm$^{-3}$) InP substrate 10. The epitaxial layers, which were lattice-matched ($\Delta a/a < 0.05\%$) to the substrate, comprised a 4 μm thick, Sn-doped n-type InP cladding layer 22 (n = $5 \times 10^{18}$ cm$^{-3}$), an 0.7 μm thick, unintentionally doped n-type InGaAsP ($\lambda = 1.3$ μm) active layer 24, a 2 μm thick, Zn-doped p-type InP cladding layer 26 (p = $5 \times 10^{18}$ cm$^{-3}$), and an 0.5 μm thick, p-type InGaAsP contact-facilitating layer 28 ($\lambda = 1.1$ μm, p = $1 \times 10^{19}$ cm$^{-3}$).

The metallizations for contacts 30 and 32 were electron-beam evaporated through shadow masks. The annular contact 30 comprised a Au/Sn/Cr/Au sandwich metallization. The dot contacts 32 were 35 μm in diameter and comprised, for comparison purposes, either 800 Å of 1 wt.% BeAu alloy, as in the prior art, or 500 Å of Pt.

Prior to sintering, the surface of layer 28 was capped with SiO$_2$ to prevent the out-diffusion of P. Then, the BeAu and Pt contacts were heated in forming gas to a temperature of 420° C. for 6 minutes and 500° C. for 15 minutes, respectively. Approximately the first 4 minutes were required for the sample to reach the furnace temperature. A low specific-contact resistance of $\sim 1 \times 10^{-5}$ Ω-cm$^2$ was obtained for both BeAu and Pt contacts, equivalent to the lowest value obtained for contact metallizations on p-InGaAsP ($\lambda = 1.1$ μm) using either prior art Zn/Au contacts [see, I. Umebu et al, *Electronics Letters*, Vol. 14, p. 499 (1978)] or Ti/Pt/Au plus zinc diffusion (see, M. Ettenberg et al, supra).

Previous examination of the 800 Å thick BeAu contacts showed that gold locally penetrated the p-InGaAsP contact-facilitating layer, in the form of a gold-indium alloy, to a depth of 1–1.2 k Å. Using Rutherford backscattering, the presence of gold was detected at the p-InP cladding layer-active layer interface to a concentration of $\sim 6 \times 10^{19}$ cm$^{-3}$. Using 2.0 μm, the thickness of the p-InP layer, and 2 minutes, the alloying time at 420° C., as the diffusion depth and time, respectively, the diffusivity at 420° C. of gold in the p-InP cladding layer is roughly estimated to be $\sim 8 \times 10^{-11}$ cm$^2$/sec.

Examination of our 500 Å thick Pt contact, using a well-known cylindrical grooving technique, showed that Pt directly interacts with the p-InGaAsP contact-facilitating layer to a depth of $\sim 400$ Å. This interaction region probably comprises PtIn$_2$, PtP$_2$ [see, D. Brasen et al, *Journal of Electrochemical Society*, Vol. 130 p. 1473, (1983)], PtGa and PtAs$_2$ [see, C. Fontaine et al, *Journal of Applied Physics*, Vol. 54, p. 1404 (1983)]. Using secondary ion mass spectroscopy (SIMS) analysis with a Cs$^+$ ion beam and Auger electron spectroscopy (AES), the Pt depth profile through the device wafer was obtained. To provide a depth scale, the Ga depth profile was used to determine the positions of the InGaAsP/InP interfaces. The thicknesses of the epitaxial layers were determined by cylindrical grooving. AES analysis indicated that Pt penetrates the entire p-InGaAsP contact-facilitating layer 28. Using SIMS analysis, the Pt concentration was estimated to drop below $10^{16}$ cm$^{-3}$ within the p-InP cladding layer 26, $\sim 0.5$ μm from the interface between layers 26 and 28. using 0.5 μm, the penetration depth into InP, and 11 minutes, the alloying time at 500° C., as the diffusion depth and time, respectively, the diffusivity at 500° C. of Pt in the p-InP cladding layer 26 was roughly estimated to be $9 \times 10^{-13}$ cm$^2$/sec. The diffusivity of Pt in InP at 500° C. is thus $\sim 10^2$ smaller than the diffusivity of Au at 420° C.

LEDs with either BeAu or Pt contacts were burned-in at 16 kA/cm$^2$ and 85° C. junction temperature for 100 h. No degradation in light output or DSDs were observed. After the burn-in, the devices were subjected to a lifetest at 20 kA/cm$^2$ and 200° C. junction temperature. After $\sim 3 \times 10^3$ h, LEDs with our Pt contacts remained free of DSDs and their light output degraded only 5–9%. However, after $\sim 10^2$ h, large (2–4 μm diameter) DSDs were observed in LEDs with BeAu contacts, and the light output degraded 7–23% from the initial value. These results directly show that DSDs form in InP/InGaAsP LEDs as a result of gold migration from the BeAu contact.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In particular, sintered platinum contacts are also useful for semiconductor lasers, and, indeed, 1000 Å thick Pt contacts have been used successfully to form elongated, stripe geometry contacts to the p-InGaAsP contact-facilitating layer of InP/InGaAsP lasers; e.g., well-known double channel planar buried heterostructure (DCPBH) lasers and gain-guided lasers.

What is claimed is:

1. A method of fabricating a device, which includes forming a low specific-contact resistance electrical contact on a layer of an In-based, Group III-V compound semiconductor, comprising the steps of:
   (a) depositing a thin layer of essentially only Pt on said In-based layer, and
   (b) sintering said layers at a temperature of about 450°–525° C. for a time of about 5–30 minutes in a reducing ambient.

2. The method of claim 1 wherein said Pt layer is about 100 to 2000 Å thick.

3. The method of claim 2 wherein said Pt layer is formed by electron beam deposition.

4. The method of claim 1 wherein said In-based layer comprises p-type InGaAsP.

5. The method of claim 1 wherein said In-based layer comprises p-type InGaAs.

6. The method of claim 4 wherein said specific-contact resistance is about $1 \times 10^{-5}$ Ω-cm$^2$ and said sintering step (b) takes place at about 500° C. for about 15–30 minutes.

7. The method of claims 1, 2, 3, 4, 5 or 6 wherein said device comprises a light emitting diode.

8. The method of claims 1, 2, 3, 4, 5 or 6 wherein said device comprises a laser.

9. A method of fabricating a device, which includes a low specific-contact resistance electrical contact on a layer of an In-based, Group III-V compound semiconductor, comprising the steps of:
   (a) epitaxially growing said In-based layer as a p-type semiconductor composition selected from the group consisting of InGaAsP and InGaAs,
   (b) electron beam depositing a thin layer of essentially only Pt to a thickness of about 100 to 2000 Å on a restricted portion of said In-based layer through a shadow mask,
   (c) capping said In-based layer to prevent the out-diffusion of volatile elements therefrom, and
   (d) sintering said layers at a temperature of about 450°–525° C. for a time of about 5–30 minutes in a reducing ambient.

10. The method of claim 9 wherein said electrical contact has a specific-contact resistance of about $1-2\times10^{-5}\Omega\text{-cm}^2$.

11. The method of claim 10 wherein said resistance is about $1\times10^{-5}\Omega\text{-cm}^2$ and said sintering step (d) takes place at about 500° C. for about 15–30 minutes.

* * * * *